US008665970B2

(12) United States Patent
Larsson et al.

(10) Patent No.: US 8,665,970 B2
(45) Date of Patent: Mar. 4, 2014

(54) METHOD AND ARRANGEMENT RELATED TO BLIND DETECTION

(75) Inventors: Erik Larsson, Linköping (SE); Reza Moosavi, Linköping (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 280 days.

(21) Appl. No.: 13/145,282

(22) PCT Filed: Apr. 29, 2011

(86) PCT No.: PCT/SE2011/050535
§ 371 (c)(1),
(2), (4) Date: Jul. 19, 2011

(87) PCT Pub. No.: WO2012/118419
PCT Pub. Date: Sep. 7, 2012

(65) Prior Publication Data
US 2012/0219096 A1 Aug. 30, 2012

Related U.S. Application Data

(60) Provisional application No. 61/447,385, filed on Feb. 28, 2011.

(51) Int. Cl.
*H04B 14/04* (2006.01)

(52) U.S. Cl.
USPC .......... 375/242; 375/260; 375/262; 375/265; 375/267

(58) Field of Classification Search
USPC ............... 375/242, 341; 332/106; 348/488
See application file for complete search history.

(56) References Cited

U.S. PATENT DOCUMENTS

| | | | |
|---|---|---|---|
| 4,964,126 A * | 10/1990 | Musicus et al. ............ 714/797 |
| 6,574,289 B1 | 6/2003 | Tran et al. |
| 6,671,326 B1 | 12/2003 | Tortelier |
| 2004/0170236 A1 | 9/2004 | Kajita et al. |
| 2004/0185886 A1 | 9/2004 | Matsumoto |
| 2009/0003301 A1 | 1/2009 | Reial et al. |

OTHER PUBLICATIONS

Imad et al., "Blind Frame Synchronization for Error Correcting Codes having a Sparse Parity Check Matrix, IEEE Transactions on Communications," Jun. 2009, pp. 1574-1577, vol. 57, No. 6, IEEE Service Center, Piscataway, NJ.
Imad et al., "Theoretical Analysis of a MAP Based Blind Frame Synchronizer, IEEE Transactions on Wireless Communications," Nov. 2009, pp. 5472-5476, vol. 8, No. 11, IEEE Service Center, Piscataway, NJ.
Moosavi et al., "A Fast Scheme for Blind Identification of Channel Codes," 54th IEEE Global Communications Conference (Globecom), May 10, 2011, pp. 1-6, IEEE.

(Continued)

*Primary Examiner* — Dhaval Patel
(74) *Attorney, Agent, or Firm* — Coats and Bennett, P.L.L.C.

(57) ABSTRACT

Method and arrangement for use in a receiving node, for determining whether received data is encoded with a certain channel code candidate. The method involves obtaining baseband data encoded with an unknown channel code and calculating the respective posterior probabilities that a set of syndrome checks are satisfied, given the obtained data, which syndrome checks are associated with the channel code candidate. The method further involves combining the posterior probabilities and determining whether the channel code candidate was used for encoding the obtained data, based on the combined posterior probabilities.

14 Claims, 8 Drawing Sheets

(56) References Cited

OTHER PUBLICATIONS

Wikipedia, "Z-test," Feb. 27, 2011, pp. 1-3, http://en.wikipedia.org/w/index.php?title=Z-test&oldid=416204751.

Yoshikawa et al., "Construction of Rate-Compatible Low Density Parity Check Codes for Fast Blind Rate Estimation," Mem. Fac. Eng., Sep. 30, 2005, pp. 27-36, vol. 46, Osaka City Univ.

* cited by examiner

ROC for GLRT test for SNR of 5 dB

Figure 6

ROC for GLRT test for SNR of 10 dB    Figure 7

Figure 8

| b1 | b2 | c1 | c2 | c3 | c4 |
|----|----|----|----|----|----|
| 0 | 0 | 0 | 0 | 0 | 0 |
| 0 | 1 | 0 | 1 | 0 | 1 |
| 1 | 0 | 1 | 0 | 1 | 0 |
| 1 | 1 | 1 | 1 | 1 | 1 |

Figure 9

| | Scenario I | | | | Scenario II | | | |
|---|---|---|---|---|---|---|---|---|
| b | 0 | | 1 | | 1 | | 1 | |
| c | 0 | 1 | 0 | 1 | 1 | 1 | 0 | 1 |
| s | -1 | 1 | -1 | 1 | 1 | 1 | -1 | 1 |
| y | -0.63 | 0.89 | -0.9 | 0.48 | 0.81 | 0.20 | -0.62 | 0.60 |
| $l_i = \Lambda(c_i\|y_i)$ | -31.5 | 44.8 | -45.4 | 24.08 | 40.4 | 9.96 | -31.4 | 30.31 |
| α | 31.4977 | | | | -31.3802 | | | |
| β | 24.0758 | | | | 9.9645 | | | |
| δ | 24.0752 | | | | -9.9645 | | | |
| Cumulative metric: | 79.6487 | | | | -31.3802 | | | |

METHOD AND ARRANGEMENT RELATED TO BLIND DETECTION

RELATED APPLICATIONS

This application is a U.S. national stage application for international Patent Application Serial No. PCT/SE2011/050535, filed 29 Apr. 2011, and claims priority to U.S. Provisional Patent Application Ser. No. 61/447,385, filed 28 Feb. 2011.

TECHNICAL FIELD

The invention relates to a method and arrangement for determining whether a certain channel code was used for encoding observed data.

BACKGROUND

Adaptive modulation and coding (AMC) is used to meet the high demands on throughput in modern wireless systems. The idea of AMC is to change the modulation format and coding rate "on the fly" in order to adapt to a changing channel quality. This adaptation mechanism is typically supported by a control channel on which the currently used modulation and coding parameters are signaled. These control channels themselves are quite information heavy in a modern wireless system and would benefit from the use of AMC in order to conserve channel resources in favor of payload data. Then, in principle, the modulation and coding parameters of these control channels would need to be sent over a "control channel for the control channel", and so on.

However, instead of explicitly signaling the AMC parameters, so-called blind decoding could be used. The basic idea of blind decoding is to, "blindly", try to decode data collected from the channel by trying different combinations of modulation formats, channel codes and code block lengths. The set of valid combinations to try is agreed upon on beforehand. The blind decoding is supported by a Cyclic Redundancy Check (CRC), which is added to the information sequence. When the CRC matches after a decoding attempt, it is assumed that the correct modulation format, channel code and block length have been found, and that the data is uncorrupted. In some multi-user wireless systems, such as e.g. LTE, the CRC check is also used to pinpoint the intended recipient of the transmitted information, by using user specific CRC codes [1].

First, a short review of how blind decoding is implemented in LTE:

In LTE, the Physical Downlink Control Channel (PDCCH) supports different transmission formats for the Downlink Control Information (DCI), which are a priori unknown to the terminals (UEs). Each terminal will find its information by blindly decoding the incoming information by trying a set of possible formats. More precisely, the transmission of control information in LTE can be described as follows:

There are five DCI formats with different message sizes. Based on factors such as cell-coverage, the number of terminals in the cell and the scheduling granularity, one format is chosen as the downlink control information format by a transmitting node, such as an eNB. Prior to transmission, a terminal-specific CRC is appended to each control message. The attached CRC is used by each terminal to find the control information. After attaching the CRC, the control information bits are encoded with a rate-⅓ tail-biting convolutional code and the rate is matched to fit the amount of resources available for PDCCH transmission by using a circular buffer.

The mapping of PDCCHs to physical resource elements is subject to a certain structure which is based on so-called Control Channel Elements (CCE). Each CCE consists of 36 physical resource elements. Based on the instantaneous channel condition and the DCI format, the PDCCH for each terminal is mapped onto a set of CCEs. Since various aggregations of the CCEs may be used for the transmission of control information, the terminal needs to blindly detect the format of the PDCCHs by testing different CCE combinations. To reduce the complexity of the blind decoding process in LTE, the search space of each terminal which describes the set of CCEs that the terminal is supposed to monitor for possible control message is limited to 44 possibilities per frame [1].

When reviewing the prior art on ways for improving the blind decoding process, the prior art falls into two main categories, which are:

Algorithms for finding the location of the control information, and,

Algorithms for determining the correct code that is used by the encoder to encode the control data.

In the first category, a solution to decrease the computational effort of the blind decoding for LTE is proposed in the prior art. The idea is to limit the number of combinations in which the control data blocks may be arranged and located in CCEs, hence reducing the search space. For example, a tree-based concatenation of CCEs is proposed in the prior art, where the largest-sized CCE aggregation is a concatenation of smaller-sized CCE aggregations. To find the correct aggregation of CCEs, a terminal starts with the set having the smallest-size of CCE aggregation and continues with the combinations of those smaller-size CCE aggregations to search for a larger size CCE aggregation and so forth.

As discussed above, a PDCCH transmission employs circular buffer based rate matching for a rate-⅓ tail-biting convolutional code. Due to repetition of coded bits and search space overlapping between different CCE aggregation levels, multiple aggregation levels may pass the CRC checking. In the prior art, a solution to decrease the detection errors is proposed. The idea therein is to modify the circular buffer, for instance by excluding at least one coded bit from the circular buffer, such that the control information can be decoded unambiguously by the users.

In the second category, a solution to decrease the number of blind decoding attempts for high-speed downlink packet access (HSDPA) is proposed [2]. The idea is to decode the received data partially for each parameter/location combination in the search space and early terminate the decoders that yield low quality metrics. The quality metric can be cumulative log-likelihood ratios for instance.

In [3], an algorithm to estimate the parameter of a convolutional code from noisy observations in a Binary-Symmetric Channel (BSC) is proposed. The algorithm is based on so-called Expectation Maximization (EM). The authors showed that the computations can be simplified by using the concept of log-likelihood ratio algebra [4].

The blind decoding type of AMC comes at the price of a decoding delay and a considerable energy consumption in the decoder on the receiver side. Given that the receiver is a mobile device with limited battery capacity, especially the latter is of great concern, and any reduction in the decoding complexity incurred by the blind decoding strategy would be valuable.

SUMMARY

It would be desirable to obtain improved channel code detection. It is an object of the invention to enable improved channel code detection. It is further an object of the invention to provide an efficient method and arrangement for determining whether received data is encoded with a certain channel code candidate or not. These objects may be met by a method and arrangement according to the attached independent claims. Exemplifying embodiments are defined by the dependent claims.

According to a first aspect, a method is provided, which is suitable for use in a receiving node. The method comprises obtaining baseband data encoded with an unknown channel code. The method further comprises calculating the respective posterior probabilities that a set of syndrome checks are satisfied, given the obtained data, which syndrome checks are associated with the channel code candidate. The method further comprises combining the posterior probabilities and determining whether the channel code candidate was used for encoding the obtained data, based on the combined posterior probabilities.

According to a second aspect, an arrangement for determining whether received data is encoded with a certain channel code candidate is provided in a receiving node. The arrangement comprises a functional unit adapted to obtain data encoded with an unknown channel code. The arrangement further comprises a functional unit adapted to calculate the respective posterior probabilities that a set of syndrome checks are satisfied, given the obtained data, which syndrome checks are associated with the channel code candidate. The arrangement further comprises a functional unit adapted to combine the posterior probabilities, and a functional unit, adapted to determine whether the channel code candidate was used for encoding the obtained data, based on the combined posterior probabilities.

The above method and arrangement provide a computationally efficient approach or scheme for determining whether obtained data was encoded with a certain channel code candidate or not. The method and arrangement do not require knowledge of the length of the encoded data set, nor that the obtained data is decoded, which is very beneficial. Thus, the scheme suggested herein may be used e.g. in any communication system applying blind detection. Further, when e.g. different interleavers are used for different UEs, the use of the suggested scheme will entail that the position of blindly encoded data for a certain UE on a shared channel will be "revealed" to said UE. That is, the scheme may be used not only to distinguish different codes, but also to distinguish e.g. different interleavers and different user data. When a UE is assigned a specific user interleaver, the data destined to the UE, e.g. on a shared control channel, may be identified by said UE, by use of the suggested approach or scheme.

The above methods and arrangements may be implemented in different embodiments. In some embodiments the combining of posterior probabilities may involve multiplication of the posterior probabilities (or addition, in case of logarithmic values). In some embodiments the determining may involve comparing the combined posterior probabilities to a predetermined threshold. The combining and determining may involve a statistical test, such as a Generalized Likelihood Ratio Test (GLRT). The GLRT may be obtained under the assumption that the logarithmic posterior probabilities have a Gaussian distribution.

Further, in some embodiments, a set of channel code candidates may be evaluated, and posterior probabilities may be calculated for sets of syndrome checks associated with some or all of the channel code candidates, which posterior probabilities may be combined per channel code candidate. Thus, it may be determined which one of the channel code candidates that was used for encoding a set of obtained data, based on a comparison between the combined posterior probabilities of each channel code candidate, e.g. to each other, or to a predefined threshold.

BRIEF DESCRIPTION OF THE DRAWINGS

The invention will now be described in more detail by means of exemplary embodiments and with reference to the accompanying drawings, in which.

DETAILED DESCRIPTION

In this description, a solution is presented that enables a fast mechanism for determining whether a certain channel code was used to encode a set of data or not. Consequently, the solution is suitable for use e.g. in blind detection, where it should be determined which one out of a set of channel code candidates that was used for encoding a set of data.

In the proposed scheme, a receiver does not need to receive the entire set of data to determine whether a certain channel code was used to encode the set, which is typically the case in blind detection. Further, the data need not be decoded in order to determine whether a certain channel code has been used or not. The suggested scheme is valid for all types of channel codes, for which syndrome checks may be formulated, e.g. any linear channel code.

Within this document, the following notation will be used:
For a binary random variable X, the likelihood ratio of X is defined as:

$$L(X) = \frac{Pr(X=0)}{Pr(X=1)}.$$

Given another random variable Y, the conditional likelihood ratio of X given Y is defined as $$L(X|Y) = \frac{Pr(X=0|Y)}{Pr(X=1|Y)}.$$

Similarly, the Log-Likelihood Ratio (LLR) of X and the conditional log-likelihood ratio of X given Y are defined as $\wedge(X)=\log(L(X))$ and $\wedge(X|Y)=\log(L(X|Y))$, respectively.

Note that by the Bayes' rule, $$L(X \mid Y) = \frac{Pr(X = 0 \mid Y)}{Pr(X = 1 \mid Y)}$$

$$= \frac{Pr(Y \mid X = 0)\frac{Pr(X = 0)}{Pr(Y)}}{Pr(Y \mid X = 1)\frac{Pr(X = 1)}{Pr(Y)}}$$

$$= \frac{Pr(Y \mid X = 0)Pr(X = 0)}{Pr(Y \mid X = 1)Pr(X = 1)}$$

$$= L(Y \mid X)L(X)$$

and thus $\Lambda(X|Y)=\Lambda(Y|X)+\Lambda(X)$.

Therefore, if X is an equiprobable binary random variable, then $L(X)=0.5/0.5=1$ and thus $\Lambda(X|Y)=\Lambda(Y|X)$. Moreover, if $Y_1, Y_2, \ldots, Y_n$ are independent random variables, then, for an equiprobable binary random variable X:

$$\Lambda(X \mid Y_1, \ldots, Y_n) = \sum_{i=1}^{n} \Lambda(X \mid Y_i)$$

Assuming that $X_1, X_2, \ldots, X_n$ are binary random variables and $Y_1, Y_2, \ldots, Y_n$ are random variables and that $\oplus$ denotes the binary addition over $\mathbb{F}_2$ (the field of binary variables) it has been shown that:

$$\Lambda(X_1 \oplus \ldots \oplus X_n \mid Y_1, \ldots, Y_n) = \log\left(\frac{1 + \prod_{i=1}^{n} \tanh\left(\frac{\ell_i}{2}\right)}{1 - \prod_{i=1}^{n} \tanh\left(\frac{\ell_i}{2}\right)}\right) \quad (1)$$

where $l_i=\Lambda(X_i|Y_i)$. This operation is referred to as the "box-plus" operation and is denoted "$\boxplus$", that is, $$\boxplus_{i=1}^{n} \ell_i = \log\left(\frac{1 + \prod_{i=1}^{n} \tanh\left(\frac{\ell_i}{2}\right)}{1 - \prod_{i=1}^{n} \tanh\left(\frac{\ell_i}{2}\right)}\right)$$

Below, the proposed scheme will be described in further detail. Regarding the notation, $b_1, b_2, \ldots, b_M$ will denote the information bearing bits, and $c_1, c_2, \ldots, c_N$ will denote the corresponding coded bits obtained from the channel encoder (e.g. in a transmitting node). The coded bits are transmitted to a receiving node through a communication channel. The corresponding observed sequence at a receiver of the coded bits (e.g. in a receiving node) will be denoted $y_1, y_2, \ldots, y_N$. It is assumed that the channel code which is used by the channel encoder is unknown to the receiver. Thus, it is desired to determine, in the receiver, which channel code that was used by the channel encoder.

It is realized that equation (1), which is normally used e.g. for Low Density Parity Check (LDPC) decoding, suggests an algorithm that might be applied in order to determine whether a specific code was used to encode a set of observed data or not. A key observation is that for any code there will be parity check relations of the form:

$$c_{i_1} \oplus c_{i_2} \oplus \ldots \oplus c_{i_P} = 0$$

for some i and P. In general, for any convolutional code, these relations can be obtained using the syndrome former of the code, and for any block code, these relations may be obtained from the parity check matrix associated with the code. The syndrome former is defined for any convolutional code. It can be tabulated, and there are standard tools available for finding the syndrome former of a code.

Now, given that the communication channel, or propagation channel, is "good enough", i.e. that the received Signal to Noise Ratio (SNR) is high enough, e.g. above a certain threshold, then the "syndrome posterior probability"

$$\gamma_i \triangleq \boxplus_{j=1}^{P} \Lambda(c_{i_j} \mid y_{i_j})$$

should be large. Hence, by collecting enough observations i and combining the corresponding conditional LLRs γi, it can be decided if a given code was used. Equation (1) can be efficiently implemented to calculate the conditional LLRs fast.

Below, the proposed scheme will be exemplified using a standard rate-½ convolutional code with constraint length 4, depicted in FIG. 1. This code will be denoted "the given code" or "the candidate code" in the example below.

Figure 1:
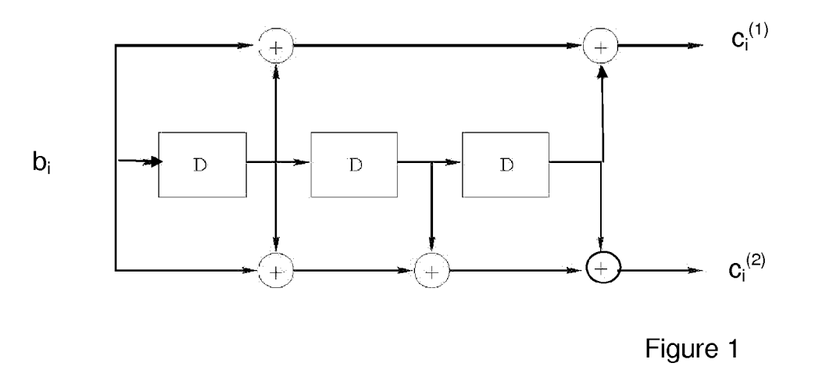
FIG. 1 illustrates a standard rate ½ convolutional code with constraint length 4. The generators for this code are g1=15 and g2=17 in octal.
Figure 2:
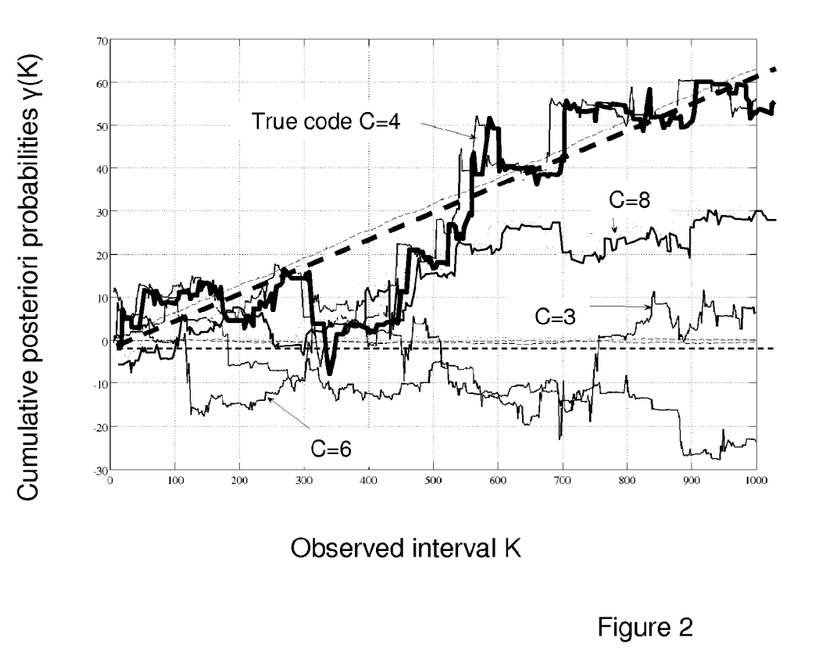
FIGS. 2-5 illustrate a comparison of cumulative metrics for rate-½ standard convolutional code with different constraint lengths, for different channel realizations, according to an exemplifying embodiment.
Figure 3:
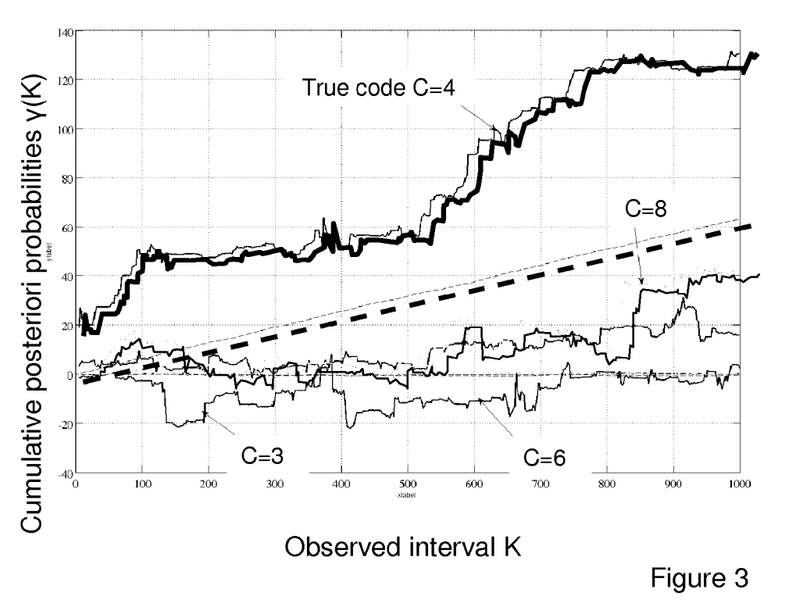
Figure 4:
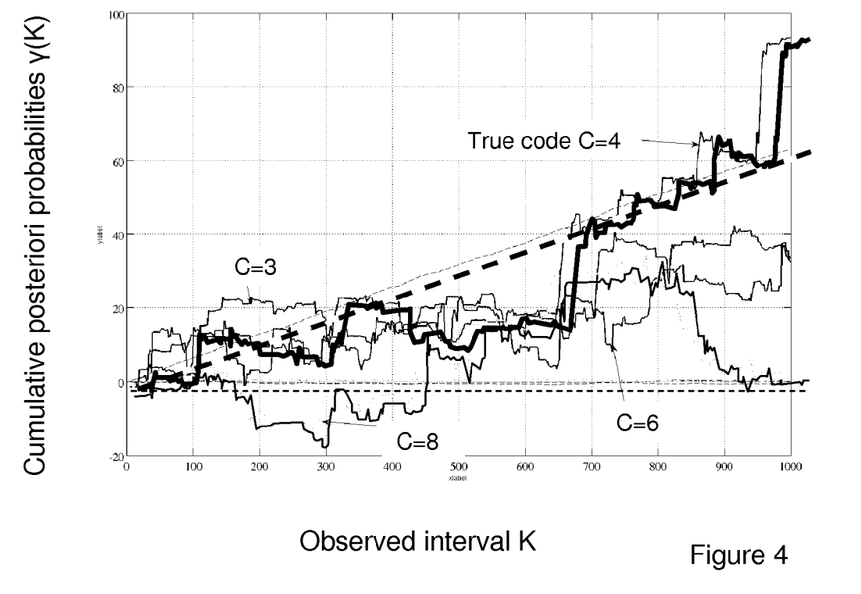
Figure 5:
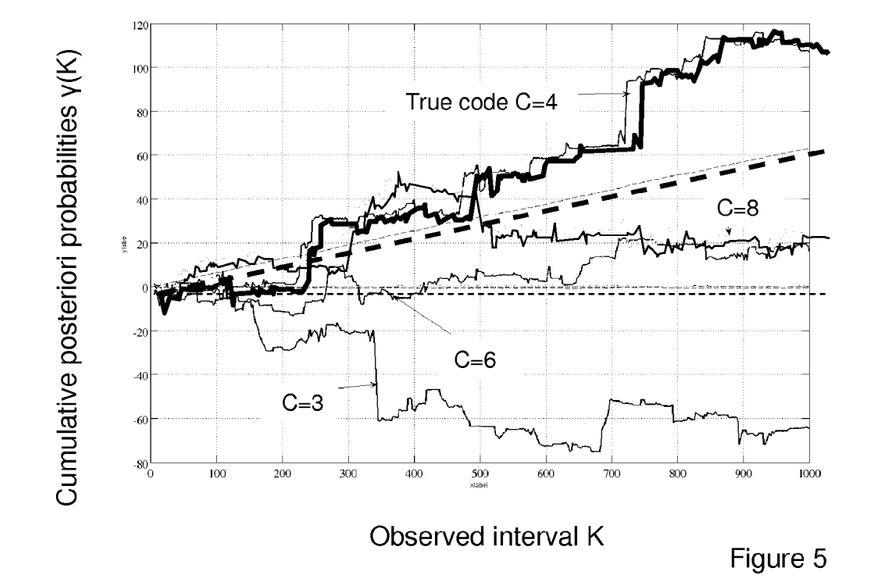

At each time instant i, the output of the encoder shown in FIG. 1 is:

$$c_i^{(1)} = b_i \oplus b_{i-1} \oplus b_{i-3}$$

and:

$$c_i^{(2)} = b_i \oplus b_{i-1} \oplus b_{i-2} \oplus b_{i-3}$$

Using the syndrome former of the given code, it may be derived that, for this specific code:

$$c_{i-1}^{(2)} \oplus c_{i-1}^{(1)} \oplus c_i^{(1)} \oplus c_{i+1}^{(1)} \oplus c_{i+1}^{(2)} \oplus c_{i+2}^{(1)} \oplus c_{i+2}^{(2)} = 0 \quad (2)$$

Therefore, the syndrome posterior probability:

$$\gamma_i \triangleq \ell_{i-1}^{(2)} \boxplus \ell_{i-1}^{(1)} \boxplus \ell_i^{(1)} \boxplus \ell_{i+1}^{(1)} \boxplus \ell_{i+1}^{(2)} \boxplus \ell_{i+2}^{(1)} \boxplus \ell_{i+2}^{(2)} \quad (3)$$

where $l_i^{(j)} = \Lambda(c_i^{(j)} | y_i^{(j)})$, would most probably take on high values. It should be noted, that herein, the observed sequence y is labeled as:

$$y_1^{(1)}, y_1^{(2)}, \ldots, y_i^{(1)}, y_i^{(2)}, \ldots$$

rather than the conventional labeling (that is the sequence $y_1, y_2, \ldots$), in order to associate the observed sequence to the output of the encoder.

By observing, e.g. K pairs at the channel decoder, and calculating the vector of posterior probabilities, in this case log-likelihood probabilities, $\gamma = [\gamma_1, \gamma_2, \ldots, \gamma_K]^T$ it may be decided whether the channel encoder used the given convolutional code, i.e. the evaluated candidate code, to encode the data or not. In order to enable such a decision, the syndrome posterior probabilities may be combined in different ways, which will be exemplified below.

A simple exemplifying method to determine or decide whether a certain channel code candidate was used or not may be to compare the cumulative metric $$\gamma(K) \triangleq \sum_{i=1}^{K} \gamma_i$$

with a threshold, say $\eta$; as follows:

$$\gamma(K) \underset{<H_0}{\overset{>H_1}{}} \eta \qquad (4)$$

where the hypothesis $H_1$ may imply that the evaluated candidate code (i.e. the code associated with the derived syndrome) was used by the channel encoder, and correspondingly the hypothesis $H_0$ may imply that some other code was used by the channel encoder.

As a more systematic approach to determining whether a certain channel code candidate was used or not, a statistical test based on the observed sequence $\gamma = [\gamma_1, \gamma_2, \ldots, \gamma_K]^T$ may be designed. For example, this may be done by approximating each $\gamma_i$ with independent and identically distributed (i.i.d.) Gaussian random variables as:

$\gamma_i \sim N(\lambda, \sigma_1^2)$, under $H_1$, and $\gamma_i \sim N(\lambda, \sigma_0^2)$, under $H_0$, for $i=1, 2, \ldots, K$ \qquad (5)

where $\lambda$, $\sigma_1^2$ and $\sigma_0^2$ are unknown nuisance parameters of the statistical test.

The assumption of having i.i.d. distribution can be justified with increasing the interval between each observation. Now, the distribution of the observed vector $\gamma$ under the two hypotheses can be written as:

$$Pr_{\gamma|H_1}(\gamma | H_1) = \prod_{i=1}^{K} \frac{1}{\sqrt{2\pi\sigma_1}} \exp\left(-\frac{(\gamma_1 - \lambda)^2}{2\sigma_1^2}\right), \text{ under } H_1, \qquad (6)$$

and $$Pr_{\gamma|H_0}(\gamma | H_0) = \prod_{i=1}^{K} \frac{1}{\sqrt{2\pi\sigma_0}} \exp\left(-\frac{(\gamma_i)^2}{2\sigma_0^2}\right), \text{ under } H_0$$

A Generalized Likelihood Ratio Test (GLRT) may be used to distinguish between $H_0$ and $H_1$, e.g. as:

$$\Delta(\gamma) = \frac{\max_{\lambda, \sigma_1} \gamma | H_1(\gamma | H_1)}{\max_{\sigma_0} \gamma | H_0(\gamma | H_0)} \underset{<H_0}{\overset{>H_1}{}} \eta \qquad (7)$$

A direct calculation shows that the GLRT test (7) can be expressed equivalently as:

$$\frac{\hat{\sigma}_0^2}{\hat{\sigma}_1^2} \underset{<H_0}{\overset{>H_1}{}} \eta^{\frac{2}{K}} \qquad (8)$$

where $$\hat{\sigma}_0^2 \triangleq \frac{1}{K} \sum_{i=1}^{K} \gamma_i^2$$

and $$\hat{\sigma}_1^2 \triangleq \frac{1}{K} \sum_{i=1}^{K} (\gamma_i - \hat{\lambda})^2$$

with $$\hat{\lambda} = \frac{1}{K} \sum_{i=1}^{K} \gamma_i$$

The proposed scheme has been evaluated for rate-½ convolutional codes with four different constraint lengths C, namely the lengths 3, 4, 6 and 8. Two hypotheses $H_1$ and $H_0$ have been formed, where, under the hypothesis $H_1$, the "true code" with C=4 is used at the transmitter to encode the data, and under the hypothesis $H_0$, one of the rate-½ convolutional codes with constraint lengths C=3, C=6 or C=8 is used to encode the data. For the rate-½ convolutional code with constraint length C=4, the syndrome posterior probability is given by (3). Monte Carlo simulations have been performed to evaluate the performance of the proposed scheme.

FIGS. 2-5 show the cumulative metric $\gamma(K)$ as a function of the observed interval K for different codes. Results are plotted for four random (anecdotal) channel realizations. The SNR is 4 dB for all curves (which corresponds to a bit error probability of 0.1). The bold lines in FIGS. 2-5 are associated with the code having constraint length C=4. The dashed lines illustrate the mean values of $\gamma(K)$. It can be seen that the cumulative metric $\gamma(K)$ is a noisy linear function of the observed interval K for the true code, i.e. the standard rate-½ convolutional code with constraint length 4, but not for the other code.

Figure 6:
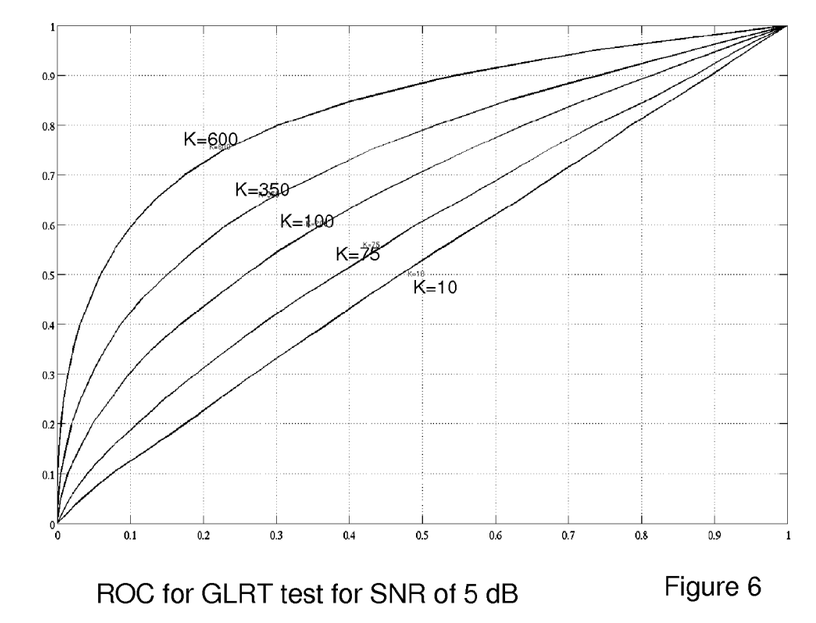
FIGS. 6-7 illustrate the Receiver Operating Characteristic (ROC) of the proposed scheme when a GLRT test is applied, according to an exemplifying embodiment, for two different values of SNR (5 dB and 10 dB) and also different values of the observed interval K.
Figure 7:
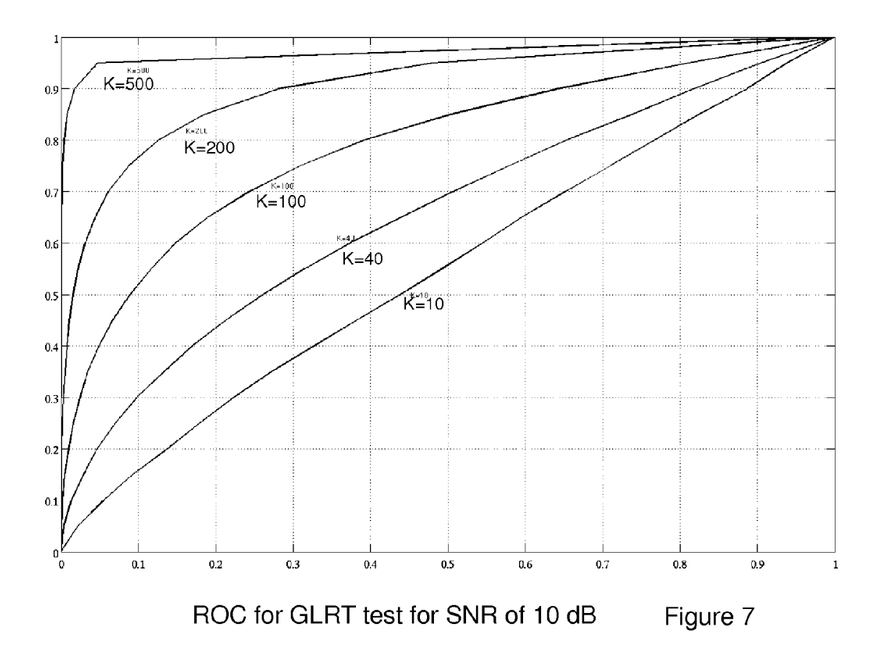

FIGS. 6 and 7 show the receiver operating characteristic (ROC) of the proposed scheme when GLRT test is applied for two different values of SNR and also different values of the observed interval K. That is, in FIGS. 6 and 7, the probability of correctly detecting the true code (probability of detection) is plotted against the probability of mistaking one of the wrong codes for the true code (probability of false alarm). It can be seen by comparing the figures, that increasing SNR improves the detection performance. It can further be seen for all cases, that by increasing the observed interval K, a better performance can be achieved.

Consequently, an algorithm is provided, that facilitates the fast blind detection of channel codes. The algorithm is efficient in terms of computational complexity. Moreover, the algorithm does not require knowledge of the exact length of the coded block in advance, and hence the algorithm may be applied in any system that uses blind decoding, such as e.g. LTE.

Below, a further example is provided, which illustrates fast blind detection of channel codes. Consider a classical communication system as the one depicted in FIG. 8, where the binary information sequence $b=[b_1, b_2, \ldots, b_N]$ is first encoded to obtain the binary coded sequence $c=[c_1, c_2, \ldots, c_M]$, and then the coded bits are modulated and the resulting symbols $s=[s_1, s_2, \ldots, s_L]$ are transmitted over a communication channel. Typically, the communication channel introduces noise and other impairments to the transmitted sequence.

Figure 8:
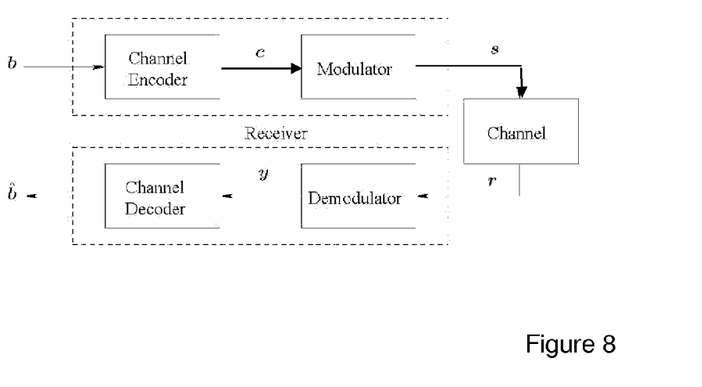
FIG. 8 is a schematic view illustrating a communication system according to the prior art.

At the receiver, the received sequence $y=[y_1, y_2, \ldots, y_L]$ is demodulated to obtain the sequence $l=[l_1, l_2, \ldots, l_M]$ of conditional LLRs defined as:

$$l_i = \Lambda(c_i | y_i) = \log\left(\frac{Pr(c_i = 0 | y)}{Pr(c_i = 1 | y)}\right)$$

A demodulator providing such output is referred to as a "soft output demodulator". Finally, the channel decoder uses the soft outputs from the demodulator to determine the transmitted binary information. It should be noted that other methods than the use of LLRs could be used for deriving posterior probabilities. However, the use of LLRs is considered to be a good alternative.

Figure 9:
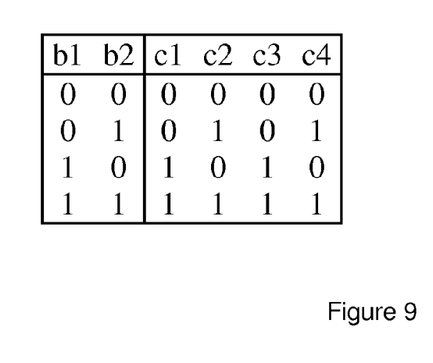
FIG. 9-10 are tables related to an exemplifying embodiment.

At the receiver, it is desired to determine whether a certain candidate channel code was used at the transmitter to encode the data, by observing the sequence of LLRs of the demodulator output. By applying the suggested scheme, this may be determined even without decoding the received sequence, which will be exemplified below:

Consider the repetition (4, 2, 2) channel code C, given by the table illustrated in FIG. 9, where b=[$b_1$, $b_2$] and c=[$c_1$, $c_2$, $c_3$, $c_4$] denote the information and the coded bits, respectively. This code has four codewords: $C_0$=[0, 0, 0, 0], $C_1$=[0, 1, 0, 1], $C_2$=[1, 0, 1, 0] and $C_4$=[1, 1, 1, 1], and for all the codewords, the following syndrome checks may be derived:

$$c_1 \oplus c_3 = 0 \quad (9)$$

$$c_2 \oplus c_4 = 0 \quad (10)$$

$$c_1 \oplus c_2 \oplus c_3 \oplus c_4 = 0 \quad (11)$$

That is, all the coded bits obtained from this channel code must satisfy the above relations.

If the transmission were error-free, one could easily find out whether the received sequence has been encoded with C by checking the syndrome checks (9)-(11). For example, it could be determined that the received sequence [01011011] (corresponding to the transmission of two concatenated codewords) is not obtained from C, since for the second codeword, i.e. [1011], the syndrome checks (10) and (11) do not pass, since $0 \oplus 1 \neq 0$ ($0 \oplus 1=1$) and $1 \oplus 0 \oplus 1 \oplus 1 \neq 0$ ($1 \oplus 0 \oplus 1 \oplus 1=1$).

However, as discussed earlier, the channel generally introduces noise (and/or other impairments) to the transmitted signal and hence the syndrome checks cannot be performed directly. Nevertheless, the fact that any codeword obtained from C must satisfy the syndrome checks (9)-(11) may still be used in order to determine whether the transmitter/channel encoder has used C to encode the data or not, by use of the suggested scheme. More precisely, given that the channel does not deteriorate the transmitted signal too much (that is if the received signal-to-noise-ratio (SNR) is high enough), then for any codeword C=[$c_1$, $c_2$, $c_3$, $c_4$], the "syndrome posterior probabilities" $\Lambda(c_1 \oplus c_3|y)$, $\Lambda(c_2 \oplus c_4|y)$ and $\Lambda(c_1 \oplus c_2 \oplus c_3 \oplus c_4|y)$ would most probably take on high values. Therefore, by collecting enough observations, it could be decided whether C was used to encode the data or not. The syndrome posterior probabilities can be calculated efficiently via:

$$\Lambda(X_1 \oplus \ldots \oplus X_n | Y_1, \ldots, Y_n) = \log\left(\frac{1 + \prod_{i=1}^{n} \tanh\left(\frac{\ell_i}{2}\right)}{1 - \prod_{i=1}^{n} \tanh\left(\frac{\ell_i}{2}\right)}\right)$$

where li=$\Lambda$ (Xi|Yi).

To illustrate the procedure described above, an example will be described below, which involves transmission of two information bits over an Additive White Gaussian Noise (AWGN) channel (corresponding to transmission of one codeword). In this example it is assumed that the modulator uses Binary Phase Shift Keying (BPSK) with unit average energy. Two scenarios will be considered:

Scenario I: The code C is used to encode the data at the transmitter, and

Scenario II: A random code is chosen at the transmitter.

Let $\alpha$, $\beta$ and $\delta$ denote the three syndrome posterior probabilities corresponding to the syndrome checks (9)-(11) associated with the code C, that is:

$$\alpha = \Lambda(c_1 \oplus c_3 | y_1, y_3) \quad (12)$$

$$\beta = \Lambda(c_2 \oplus c_4 | y_2, y_4) \quad (13)$$

$$\gamma = \Lambda(c_1 \oplus c_2 \oplus c_3 \oplus c_4 | y_1, y_2, y_3, y_4) \quad (14)$$

Figure 10:
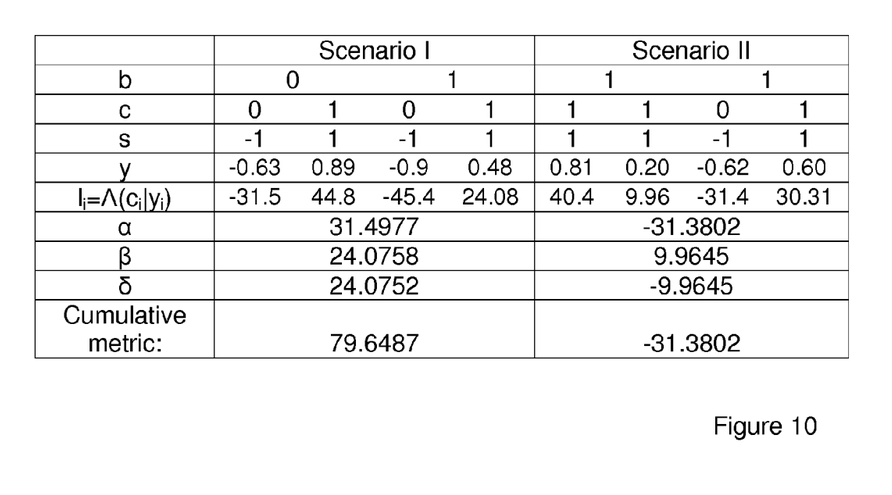

FIG. 10 shows a table illustrating the procedures for a sample transmission. The SNR is taken to be 14 dB ($\sigma$=0.2) in this example. Note that for BPSK demodulation, the conditional LLR $l_i$ is $$l_i = \Lambda(c_i | y_i) = \frac{2y_i}{\sigma^2}$$

where $\sigma^2$ represents the noise variance.

It can be seen that the syndrome posterior probabilities $\alpha$, $\beta$ and $\delta$ for the true code C (Scenario I) are larger than those of the random code (Scenario II). More specifically, $\alpha$ and $\delta$ take on negative values for the "wrong" code in this example.

One possible approach to concluding whether an evaluated code candidate, in this case C, was used or not is to add (in case of logarithmic values) all the syndrome posterior probabilities ($\alpha$, $\beta$ and $\delta$) and compare the cumulative syndrome posterior probabilities with a threshold, say $\eta$, to determine if C was used at the transmitter to encode the data. The last row in the table in FIG. 10 and below shows the cumulative syndrome posterior probabilities for the given example. As it is seen, the cumulative metric is much higher for the true code, i.e. 79.6, as compared to −31.4

Figure 11:
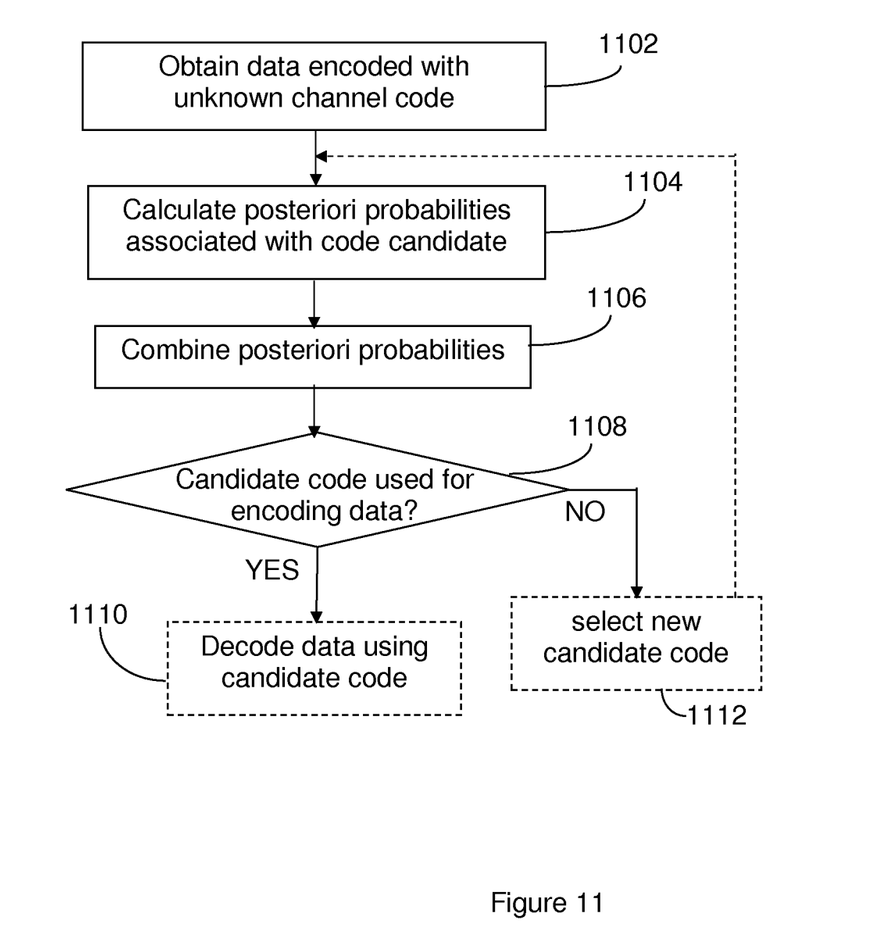
FIG. 11 is a flow chart illustrating a procedure in a receiving node, according to an exemplifying embodiment.

Exemplifying Procedure, FIG. 11

An embodiment of the procedure of determining whether received data is encoded with a certain channel code candidate will now be described with reference to FIG. 11. The procedure could be performed in a receiving node, such as e.g. a mobile terminal, or other communicating network node in a communication system.

Initially, baseband data is obtained in an action 1102, which data has been encoded with an unknown channel code. Then, the respective posterior probabilities that a set of syndrome checks are satisfied, given the obtained data, may be calculated in an action 1104. The set of syndrome checks are associated with the channel code candidate which is to be evaluated. The posterior probabilities are combined in an action 1106. The posterior probabilities could be combined in different ways, depending e.g. on the requirements related to the accuracy of the result.

For example, the posterior probabilities could be multiplied (which corresponds to addition in case of logarithmic values), and the accumulated value could be compared to a predefined threshold, in order to determine whether the channel code candidate was actually used for encoding the obtained data. Alternatively, a statistical test could be applied on the posterior probabilities, such as a GLRT, e.g. obtained under the assumption that the logarithmic posterior probabilities have a Gaussian distribution. When it is determined or decided, based on the combined posterior probabilities, that the channel code candidate was used for encoding the obtained data, the channel code candidate may be used to decode the data.

When it is determined or decided that the channel code candidate was not used for encoding the obtained data, the channel code candidate may be rejected, and another candidate may be evaluated, e.g. another channel code candidate within a predefined set of channel code candidates. A plurality of different candidates could also be evaluated in parallel, i.e. simultaneously, and the candidate generating e.g. highest value of combined posterior probabilities could be determined as the "true code", i.e. the channel code candidate which was used for encoding the obtained data.

Figure 12:
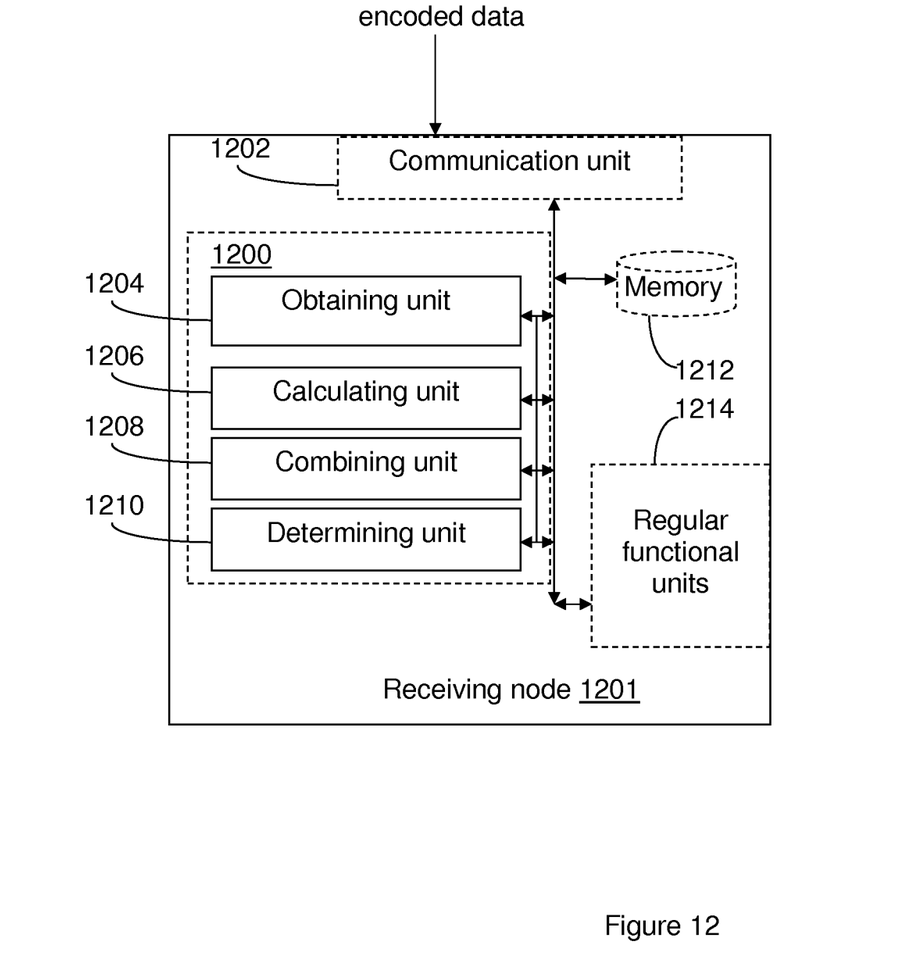
FIG. 12 is a block diagram illustrating an arrangement in a receiving node, according to an exemplifying embodiment.

Exemplifying Arrangement, FIG. 12

Below, an example arrangement 1200, adapted to enable the performance of the above described procedure of determining whether received data is encoded with a certain channel code candidate will be described with reference to FIG. 12. The arrangement is suitable for use in a receiving node and is illustrated as being located in a receiving node 1201 in FIG. 12. The receiving node could be e.g. a mobile terminal or other communicating network node in a communication system. The arrangement 1200 is further illustrated as to communicate with other entities via a communication unit 1202 which may be considered to comprise conventional means for wireless and/or wired communication. The arrangement or receiving node may further comprise other functional units, such as e.g. functional units providing regular mobile terminal functions, such as decoding of obtained data, and may further comprise one or more storage units 1212.

The arrangement 1200 comprises an obtaining unit 1204, adapted to obtain data encoded with an unknown channel code. The arrangement 1200 further comprises a calculating unit 1206, adapted to calculate the respective posterior probabilities that a set of syndrome checks are satisfied, given the obtained data, where the syndrome checks are associated with the channel code candidate to be evaluated. The arrangement 1200 may further comprise a combining unit 1208, adapted to combine the posterior probabilities. Further, the arrangement 1200 may comprise a determining unit, adapted to determine whether the channel code candidate was used for encoding the obtained data, based on the combined posterior probabilities.

When it is determined that the channel code candidate was used for encoding the obtained data, the channel code candidate could be indicated to a decoding unit in the receiving node 1201, for use when decoding the obtained data. When it is determined that the channel code candidate was not used for encoding the obtained data, the channel code candidate could be rejected, and a new channel code could be evaluated. The arrangement may be adapted to evaluate a plurality of channel code candidates simultaneously, as previously described.

Figure 13:
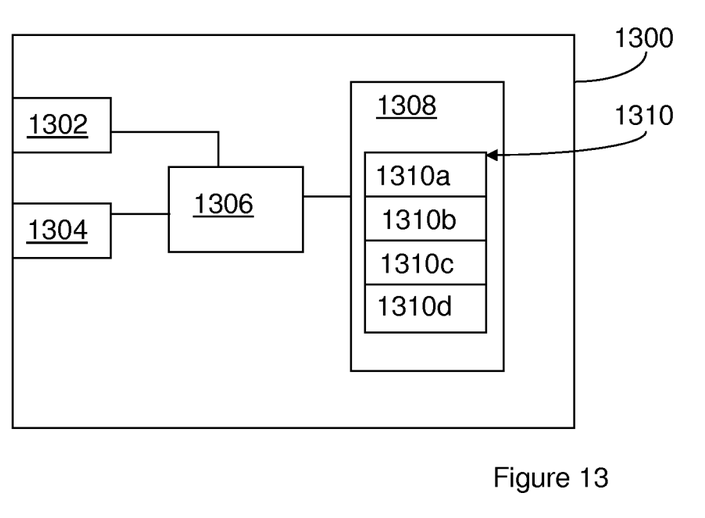
FIG. 13 is a block diagram illustrating an arrangement, according to an exemplifying embodiment.

Exemplifying Arrangement, FIG. 13

FIG. 13 schematically shows an embodiment of an arrangement 1300 in a receiving node, which also can be an alternative way of disclosing an embodiment of the arrangement in a receiving node illustrated in FIG. 12. Comprised in the arrangement 1300 are here a processing unit 1306, e.g. with a DSP (Digital Signal Processor). The processing unit 1306 may be a single unit or a plurality of units to perform different actions of procedures described herein. The arrangement 1300 may also comprise an input unit 1302 for receiving signals from other entities, and an output unit 1304 for providing signal(s) to other entities. The input unit 1302 and the output unit 1304 may be arranged as an integrated entity.

Furthermore, the arrangement 1300 comprises at least one computer program product 1308 in the form of a non-volatile memory, e.g. an EEPROM (Electrically Erasable Programmable Read-Only Memory), a flash memory and a hard drive. The computer program product 1308 comprises a computer program 1310, which comprises code means, which when executed in the processing unit 1306 in the arrangement 1300 causes the arrangement and/or the receiving node to perform the actions of the procedure described earlier in conjunction with FIG. 11.

The computer program 1310 may be configured as a computer program code structured in computer program modules. Hence, in an examplifying embodiment, the code means in the computer program 1310 of the arrangement 1300 comprises an obtaining module 1310a for obtaining data encoded with an unknown channel code. The computer program further comprises a calculating module 1310b for calculating posterior probabilities that a set of syndrome checks are satisfied. The computer program 1310 further comprises a combining module 1310c for combining the posterior probabilities, and a determining module 1310d for determining whether the channel code candidate was used for encoding the obtained data, based on the combined posterior probabilities.

The modules 1310a-d could essentially perform the actions of the flow illustrated in FIG. 11, to emulate the arrangement in a receiver node illustrated in FIG. 12. In other words, when the different modules 1310a-d are executed in the processing unit 1306, they may correspond to the units 1204-1210 of FIG. 12.

Although the code means in the embodiment disclosed above in conjunction with FIG. 13 are implemented as computer program modules which when executed in the processing unit causes the arrangement and/or receiving node to perform the actions described above in the conjunction with figures mentioned above, at least one of the code means may in alternative embodiments be implemented at least partly as hardware circuits.

The processor may be a single CPU (Central processing unit), but could also comprise two or more processing units. For example, the processor may include general purpose microprocessors; instruction set processors and/or related chips sets and/or special purpose microprocessors such as ASICs (Application Specific Integrated Circuit). The processor may also comprise board memory for caching purposes. The computer program may be carried by a computer program product connected to the processor. The computer program product may comprise a computer readable medium on which the computer program is stored. For example, the computer program product may be a flash memory, a RAM (Random-access memory) ROM (Read-Only Memory) or an EEPROM, and the computer program modules described above could in alternative embodiments be distributed on different computer program products in the form of memories within the receiver node.

While the procedure as suggested above has been described with reference to specific embodiments provided as examples, the description is generally only intended to illustrate the inventive concept and should not be taken as limiting the scope of the suggested methods and arrangements, which are defined by the appended claims. While described in general terms, the methods and arrangements may be applicable e.g. for different types of communication systems, using commonly available communication technologies, such as e.g. WCDMA or LTE or broadcast technologies.

It is also to be understood that the choice of interacting units or modules, as well as the naming of the units are only for exemplifying purpose, and client and server nodes suitable to execute any of the methods described above may be configured in a plurality of alternative ways in order to be able to execute the suggested process actions.

It should also be noted that the units or modules described in this disclosure are to be regarded as logical entities and not with necessity as separate physical entities.

REFERENCES

[1] E. Dahlman, S. Parkvall, J. Sköld and P. Beming, *3G Evolution HSPA and LTE for Mobile Broadband*, 2nd edition Academic Press 2008, section 16.4.7, pages 352-357.
[2] A. Reial and L. Andersson, *HS-PDSCH blind decoding*, United States Patent Application Publication 2009/003301, Jan. 1, 2009.
[3] J. Dingel and J. Hagenauer, "Parameter estimation of a convolutional encoder from noisy observations," in *Proc. of IEEE ISIT*, pp. 1776-1780, June 2007.
[4] J. Hagenauer, E. Offer and L. Papke, "Iterative decoding of binary block and convolutional codes," *IEEE Trans. Info. Theory*, vol. 42, pp. 429-445, March 1996.

ABBREVIATIONS

AMC Adaptive Coding and Modulation Format
AWGN Additive White Gaussian Noise
BPSK Binary Phase Shift Keying
BSC Binary-Symmetric Channel
CRC Cyclic Redundancy Check
CCE Control Channel Elements
DCI Downlink Control Information
GLRT Generalized Likelihood Ratio Test
HSDPA High-Speed Downlink Packet Access
PDCCH Physical Downlink Control Channel
ROC Receiver Operating Characteristic
SNR Signal-to-Noise-Ratio
LLR Log-Likelihood Ratio

The invention claimed is:

1. A method in a receiving node for determining whether received data is encoded with a certain channel code candidate, the method comprising:
    obtaining data encoded with an unknown channel code;
    calculating, for two or more different syndrome checks, the respective posterior probabilities that the two or more different syndrome checks are satisfied, given the obtained data, wherein the two or more different syndrome checks are associated with the channel code candidate;
    combining the posterior probabilities calculated for the two or more different syndrome checks; and
    determining whether the channel code candidate was used for encoding the obtained data, based on the combined posterior probabilities.

2. The method of claim 1, wherein the combining involves multiplication of the posterior probabilities.

3. The method of claim 1, wherein the determining involves comparing the combined posterior probabilities to a predetermined threshold.

4. The method of claim 1, wherein the combining and determining involves a statistical test.

5. The method of claim 4, where the statistical test is a Generalized Likelihood Ratio Test (GLRT).

6. The method of claim 5, wherein the GLRT is obtained under the assumption that the logarithmic posterior probabilities have a Gaussian distribution.

7. The method of claim 1, wherein posterior probabilities are calculated for a second set of syndrome checks associated with one or more further channel code candidates.

8. The method of claim 7, wherein the respective posterior probabilities are combined per channel code candidate.

9. The method of claim 7, further comprising:
    determining which one of the channel code candidates that was used for encoding the obtained data, based on a comparison between the combined posterior probabilities of each channel code candidate.

10. An apparatus for use in a receiving node for determining whether received data is encoded with a certain channel code candidate, the apparatus comprising:
    an obtaining unit, adapted to obtain data encoded with an unknown channel code,
    a calculating unit, adapted to calculate, for two or more different syndrome checks, the respective posterior probabilities that the two or more different syndrome checks are satisfied, given the obtained data, wherein the two or more different syndrome checks are associated with the channel code candidate,
    a combining unit, adapted to combine the posterior probabilities calculated for the two or more different syndrome checks, and
    a determining unit, adapted to determine whether the channel code candidate was used for encoding the obtained data, based on the combined posterior probabilities.

11. The apparatus of claim 10, wherein the calculating unit is further adapted to calculate posterior probabilities for a second set of syndrome checks associated with one or more further channel code candidates.

12. The apparatus of claim 11 wherein the respective posterior probabilities are combined per channel code candidate.

13. The apparatus of claim 11, wherein the determining unit is further adapted to determine which one of the channel code candidates that was used for encoding the obtained data, based on a comparison between the combined posterior probabilities of each channel code candidate.

14. Network node for wireless communication, comprising the apparatus of claim 10.

* * * * *

UNITED STATES PATENT AND TRADEMARK OFFICE
CERTIFICATE OF CORRECTION

PATENT NO. : 8,665,970 B2  
APPLICATION NO. : 13/145282  
DATED : March 4, 2014  
INVENTOR(S) : Larsson et al.

Page 1 of 1

It is certified that error appears in the above-identified patent and that said Letters Patent is hereby corrected as shown below:

In the Specification

In Column 10, Line 10, in Equation (14), delete "$\gamma =$" and insert -- $\delta =$ --, therefor.

Signed and Sealed this
Second Day of September, 2014

Michelle K. Lee
*Deputy Director of the United States Patent and Trademark Office*